(12) United States Patent
Tamura

(10) Patent No.: US 6,875,306 B2
(45) Date of Patent: Apr. 5, 2005

(54) VACUUM PROCESSING DEVICE

(75) Inventor: Naoyuki Tamura, Yamaguchi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 88 days.

(21) Appl. No.: 10/218,406

(22) Filed: Aug. 15, 2002

(65) Prior Publication Data
US 2003/0168173 A1 Sep. 11, 2003

(30) Foreign Application Priority Data
Mar. 7, 2002 (JP) ........................................ 2000-062244

(51) Int. Cl.[7] .................. C23F 1/00; H01L 21/306; C23C 16/00; B65G 49/007
(52) U.S. Cl. ..................... 156/345.24; 156/345.13; 156/345.15; 156/345.31; 156/345.32; 118/719; 414/936; 414/939
(58) Field of Search .............................. 156/345.13, 15, 156/24, 31, 32; 118/719; 414/939

(56) References Cited

U.S. PATENT DOCUMENTS 5,452,521 A * 9/1995 Niewmierzycki ............ 33/520
5,512,320 A * 4/1996 Turner et al. .......... 427/255.21

* cited by examiner

Primary Examiner—Parviz Hassanzadeh
Assistant Examiner—Karla Moore
(74) Attorney, Agent, or Firm—Antonelli, Terry, Stout & Kraus, LLP

(57) ABSTRACT

A vacuum processing device includes at least one vacuum processing chamber for performing predetermined treatments to a wafer being transferred to a predetermined position within the chamber, an atmospheric transfer equipment for transferring a wafer in atmospheric air to a vacuum transfer equipment which is disposed within a vacuum transfer chamber connecting the atmospheric air and the vacuum processing chambers for transferring the wafer received from the atmospheric transfer equipment to the predetermined position within the vacuum processing chamber, and wafer position sensors disposed near the ingress path leading into the processing chamber for detecting the displacement of the wafer being transferred.

3 Claims, 4 Drawing Sheets

VACUUM PROCESSING DEVICE

FIELD OF THE INVENTION

The present invention relates to a device and method for vacuum processing, and especially relates to a vacuum processing device and method capable of transferring wafers disposed in atmospheric air to a predetermined position within a vacuum processing chamber.

DESCRIPTION OF THE RELATED ART

Japanese Patent Application Laid-Open No. 8-172034 discloses a vacuum processing device equipped with a display capable of displaying the movement of to-be-processed bodies such as wafers on a screen in real time. This device enables the operator to monitor the movement of the wafers etc. from the exterior of the vacuum processing device.

Though it is not clearly illustrated in the above-mentioned document, the vacuum processing chamber is usually equipped with a viewport, and the operator visually observes the wafers etc. from outside the vacuum processing device through the viewport in order to adjust the position of the wafers within the device.

Upon manufacturing semiconductor devices, it is common to treat a single sample body (wafer) and then to cut the wafer into plural pieces to create plural parts. The wafer is generally circular, but in many cases the parts being manufactured by cutting the wafer are rectangular. The number of parts that can be produced from a single wafer is determined by how these rectangular parts are cut out from the circular wafer, which influences the productive efficiency greatly.

If the wafer is circular, the area per unit radial width increases as the diameter of the circle increases. Therefore, it is necessary to collect parts as efficiently as possible from the outermost rim portion.

For example, upon processing wafers in a plasma etching device, the wafer stage on which the wafer is mounted is preferably smaller in diameter than the wafer to be processed so as to prevent damage caused by plasma. On the other hand, the wafer must be processed as precisely as possible and the wafer temperature must be controlled throughout the whole wafer surface. Thus, when considering only the latter requirement, the wafer stage is preferably larger in diameter than the wafer. In order to satisfy these two contradictory demands, the diameter of the stage must be smaller than the diameter of the wafer but at the same time as large as possible. Moreover, the transfer accuracy for transferring the wafer onto the stage is preferably as precise as possible.

At first, the wafer is disposed in atmospheric air. After centering or aligning the crystal orientation of the wafer, an atmospheric robot takes hold of the wafer and mounts the wafer for example on a load lock. Then, a vacuum robot disposed within a vacuum transfer chamber (buffer chamber) holds the wafer located in the load lock chamber, and transfers the same to the next stage, such as into a vacuum processing chamber. These steps are performed repeatedly.

Therefore, according to the wafer transfer procedure, after centering and aligning the orientation of the wafer, the step of transferring the wafer using a robot onto a determined wafer stage and the step of removing the wafer from the stage are performed repeatedly. The wafer is somewhat displaced every time the steps are repeated, and as the number of performed steps increases, the displacement (misalignment) is accumulated.

Conventionally, when correcting the displacement of the wafer (misalignment of the wafer on the wafer stage within a processing chamber) at the final stage, the operator adjusts the location of the arm of the transfer robot and the like based on visual observation. Recently, however, the designs of the processing devices have become more complex, and it has become difficult to form the viewport through which the operator visually observes the displacement of the wafers at a location that can be accessed easily by the operator. Even further, since it is very difficult for each operator to position his/her eyes at the same determined position when visually observing the wafers, and since the vision of each operator differs, there are differences in the displacement correction accuracy among the operators performing the task.

SUMMARY OF THE INVENTION

The present invention aims at solving the above mentioned problems of the prior art by providing a vacuum processing device capable of transferring the wafers with improved accuracy by detecting and correcting the displacement of the transferred wafer just prior to the final stage.

The present invention adopts the following structure in order to solve the above problems.

The present invention comprises a vacuum processing chamber for performing a predetermined treatment to a wafer transferred and located to a predetermined position, an atmospheric transfer equipment disposed in atmospheric air for transferring a wafer in atmospheric air to a vacuum transfer equipment, a vacuum transfer equipment disposed within a vacuum transfer chamber that connects the atmospheric air and the vacuum processing chamber for transferring the wafer received from the atmospheric transfer equipment to the predetermined position within the vacuum processing chamber, and a wafer position sensor disposed near the ingress path to the processing chamber for sensing the displacement of the transferred wafer.

DETAILED DESCRIPTION OF THE PREFERRED EMBODIMENT

Figure 1:
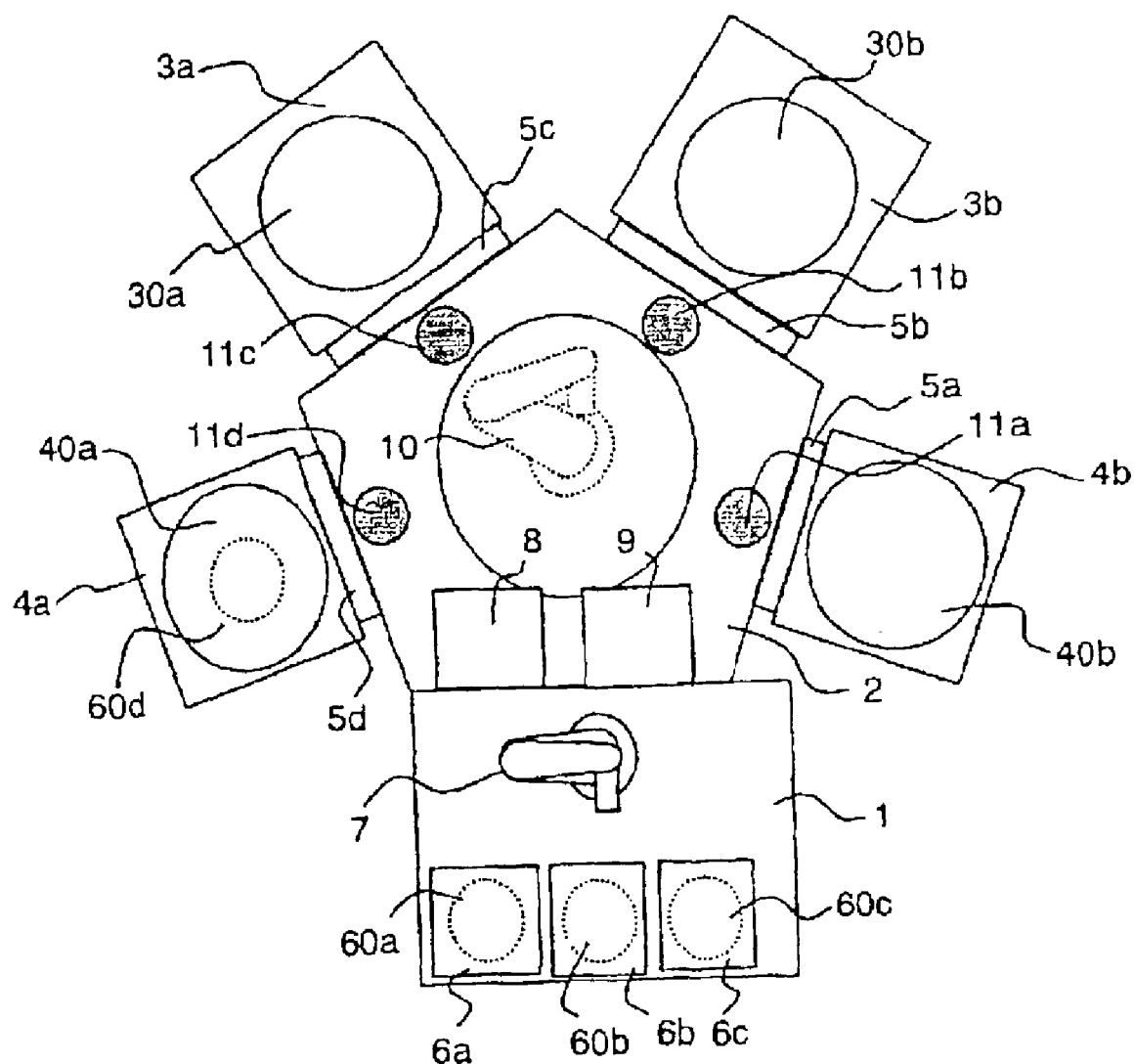
FIG. 1 is a plan view showing the vacuum processing device according to a preferred embodiment of the present invention.

The preferred embodiments of the present invention will now be explained with reference to the accompanied drawings. FIG. 1 is a plan view of a vacuum processing device which adopts the present invention. In FIG. 1, an atmospheric transfer unit designated by reference number 1 comprises an atmospheric robot 7, cassette stages 6a, 6b and 6c, and wafers 60a, 60b and 60c stored in the cassette stages. One of the cassette stages can be utilized as an orientation alignment unit for centering or aligning the crystal orientation of the wafer taken out of the cassette.

A buffer chamber is designated by reference number 2, equipped with a vacuum robot 10 used to transfer the wafer in atmospheric air into and out of the processing chamber (main processing chamber blocks 3a, 3b and subsidiary processing chamber blocks 4a, 4b), a load lock chamber 8 and an unload lock chamber 9. Reference numbers 5a, 5b, 5c and 5d denote gate valves for connecting the subsidiary processing chamber block 4b, main processing chamber block 3b, main processing chamber block 3a and subsidiary processing chamber block 4a to the buffer chamber 2, respectively.

Further, reference numbers 30a and 30b denote main processing chambers housed with in main processing chamber blocks, numbers 40a and 40b denote subsidiary processing chambers housed within subsidiary processing chamber blocks, and number 60d denotes a wafer.

Reference numbers 11a, 11b, 11c and 11d show position sensors for detecting the displacement of the transfer position of the wafers (detailed description of which will appear later). These position sensors are disposed near the ingress path through which the wafer enters and exits the processing chambers (for example, near the entrance of the processing chambers).

Moreover, in the main processing chamber blocks and the subsidiary processing chamber blocks, respectively, predetermined processes such as etching or ashing are performed. Vacuum gate valves and atmospheric gate valves each formed to the load lock chamber 8 and the unload lock chamber 9 are not shown in the drawing.

Vacuum gate valves are equipped to both the load lock chamber 8 and the unload lock chamber 9 between the buffer chamber 2, and atmospheric gate valves are equipped to both the load lock chamber 8 and the unload lock chamber 9 between the atmospheric transfer unit 1. When the vacuum processing device is at a process preparation complete status (standby status), the buffer chamber 2, the main processing chambers 3a and 3b, and the subsidiary processing chambers 4a and 4b are each maintained at a vacuum pressure suited for each process. In the following explanation, the processing steps are explained assuming that 6a is used as an orientation (centering) unit.

The atmospheric robot 7 extends, shrinks or moves its arm sideways so as to take out from cassette 6b one of the wafers stored within the cassette 6b, places the wafer on a stage within the centering unit 6a, and retrieves the arm. At this time, the centering unit corrects the position of the wafer so that it is positioned correctly within the processing chamber during the subsequent procedures.

Thereafter, the atmospheric robot 7 accesses the centering unit 6a again, takes out the wafer 60a having its position corrected, positions the wafer on a stage in the load lock chamber 8 having the atmospheric gate valve opened in advance, and retrieves therefrom. Next, the atmospheric gate valve is closed before the load lock chamber 8 is evacuated, and when the vacuum pressure is reduced to a pressure enabling the chamber to be communicated with the buffer chamber 2, the gate valve between the load lock chamber 8 and the buffer chamber 2 is released. Next, the vacuum robot 10 extends its arm to hold the wafer 60a placed inside the load lock chamber 8, and if the wafer is to be treated in the main processing chamber 30a, the gate valve 5c is released in vacuum, and the wafer 60a is transferred onto a wafer stage within the processing chamber 30a through the gate valve 5c. Next, the vacuum robot 10 shrinks and retrieves the arm before the gate valve 5c is closed, and then the processing of the wafer is performed while the atmosphere within the processing chamber 30a is set to a condition most suitable for processing the wafer.

The wafer is not only treated within processing chamber 30a, but can be transferred to another processing chamber (for example, to subsidiary processing chamber 40b) for the next treatment via the buffer chamber (vacuum chamber) 2. According to this example, after the treatment in processing chamber 30a is completed, the gate valve 5c is released so as to enable the vacuum robot 10 to access the processing chamber 30a and take out the treated wafer, and then the gate valve 5c is closed again. Next, the gate valve 5a is released and the vacuum robot 10 is rotated in position to transfer the wafer into the subsidiary processing chamber 40b. The vacuum robot places the wafer on the stage within subsidiary processing chamber 40b, and then retrieves the arm therefrom. Next, the gate valve 5a is closed and the treatment of the wafer is started in the subsidiary processing chamber 40b. Thereafter, if continuous processing is necessary, the above steps can be repeatedly performed to provide further treatment to the wafer.

When all the treatment within the vacuum processing chamber is completed, the gate valve of the processing chamber is released, the treated wafer is received by the vacuum robot, and the gate valve of the processing chamber is closed before releasing the vacuum gate valve of the unload lock chamber 9 which is prepared to receive the wafer with an evacuated inner space. Thereafter, the vacuum robot 10 places the wafer on the wafer stage of the unload lock chamber 9, and then retrieves the arm therefrom. Next, the vacuum gate valve of the unload lock chamber 9 is closed before introducing air or inert gas into the unload lock chamber 9 so as to increase the inner pressure close to atmospheric pressure. Next, the atmospheric gate valve of the unload lock chamber 9 is released, and the atmospheric robot 7 receives the treated wafer and stores the wafer into a predetermined cassette in the cassette stage.

During this continuous motion, after the wafer is taken out of the load lock chamber 8 by the vacuum robot 10, the vacuum gate valve of the load lock chamber 8 is closed and air or inert gas is introduced into the load lock chamber 8 to increase the inner pressure either equal to or close to atmospheric pressure, so as to prepare the chamber for the next wafer. As for the unload lock chamber 9, after the wafer is taken out from the chamber by the atmospheric robot 7, the atmospheric gate valve is closed to evacuate the interior of the unload lock chamber, so as to prepare the chamber for the next wafer.

As have been already explained, the wafer 60a is centered at the orientation alignment (centering) unit 6a and then handled by the atmospheric robot 7 and the vacuum robot 10 to be sent to various stages for various treatments, during which time the wafer is repeatedly placed on or removed from the stages.

Figure 2:
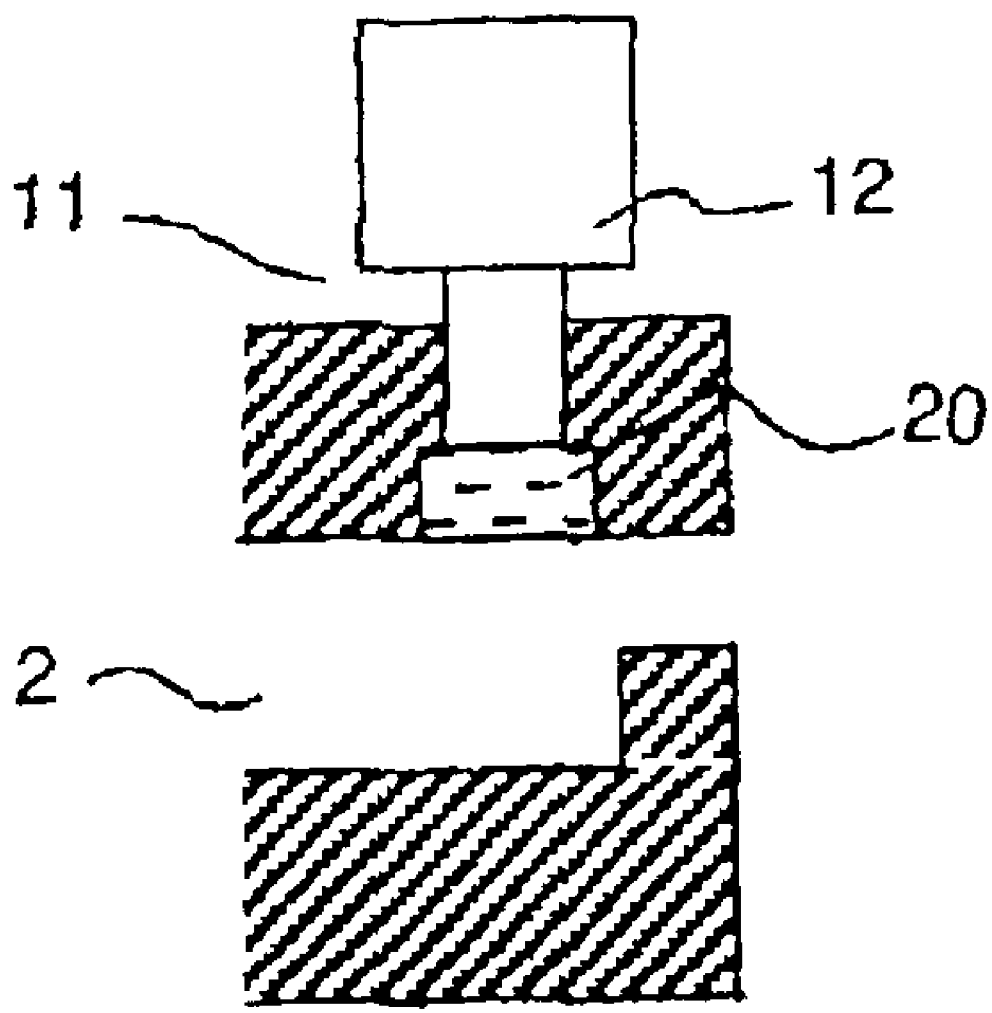
FIG. 2 illustrates a position sensor.

FIG. 2 illustrates a position sensor for detecting the position of the wafer being transferred. In FIG. 2, a position sensor is designated by reference number 11, a viewport mounted on the upper wall of the buffer chamber 2 for example by vacuum seal is designated by 20, and a TV camera and the like mounted on the viewport 20 is designated by 12. The camera is equipped with an image recognition unit not shown, which is capable of recognizing the position of the wafer being transferred.

Figure 3:
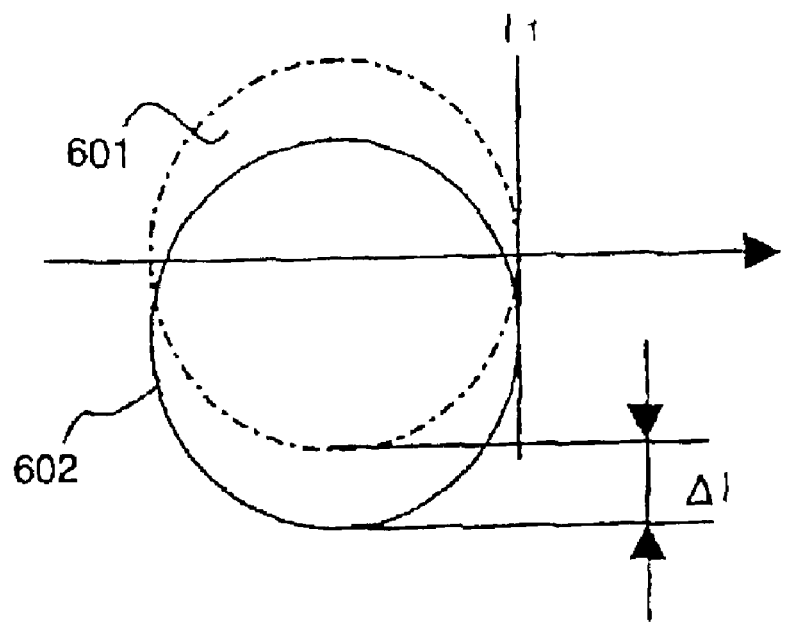
FIG. 3 shows the status of the wafer being observed through a camera.

FIG. 3 is an explanatory view showing the position of the wafer being observed through the camera. The correct position 601 of the wafer passing the reference line $l_1$ in the arrow direction is recorded in advance in the image recognizing unit. Next, the system recognizes the wafer position 602 of the actual wafer being transferred by the vacuum robot passing the reference line $l_1$. Thereafter, by comparing these two positions, the image recognition unit can determine how far the wafer is displaced from the correct position 601 when it passed the line. Therefore, by moving the arm of the vacuum robot 10 in the transverse direction with respect to the traveling direction by an amount corresponding to the detected displacement quantity $\Delta l$, the transfer position of the wafer can be corrected. Further, since the distance of travel of the wafer from the reference line $l_1$ to the center stage of the processing chamber (distance of movement in the traveling direction) can be computed in advance, the movement within this distance can be controlled sufficiently by fixed value control.

FIGS. 2 and 3 illustrate an example where the whole body of the wafer is recognized, but it is not necessary that the whole wafer be recognized, and for example, it is enough to recognize only a portion of the arc constituting the outer rim of the wafer.

Figure 4:
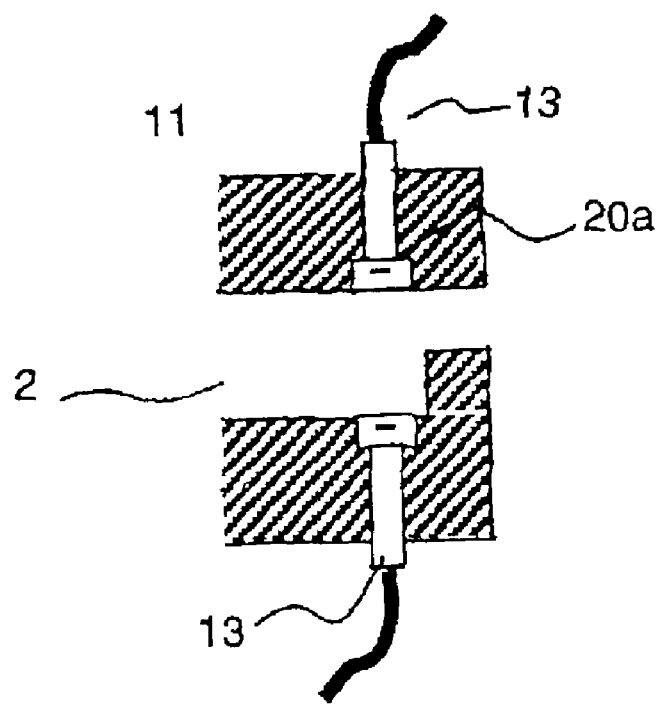
FIG. 4 illustrates another example of the position sensor.

FIG. 4 illustrates another example of the position sensor. In the drawing, reference number 11 denotes a position sensor, 20a and 20b are viewports that are fixed by vacuum seal to the upper and lower walls of the buffer chamber 2, and 13 denotes plural transmission type optical sensors that constitute the position sensor, wherein sensors 13 are set to detect the outer rim (edge) of the passing wafer, for example. Other than the transmission type optical sensors, the sensors 13 can be reflecting type optical sensors or capacitance type sensors.

Figure 5:
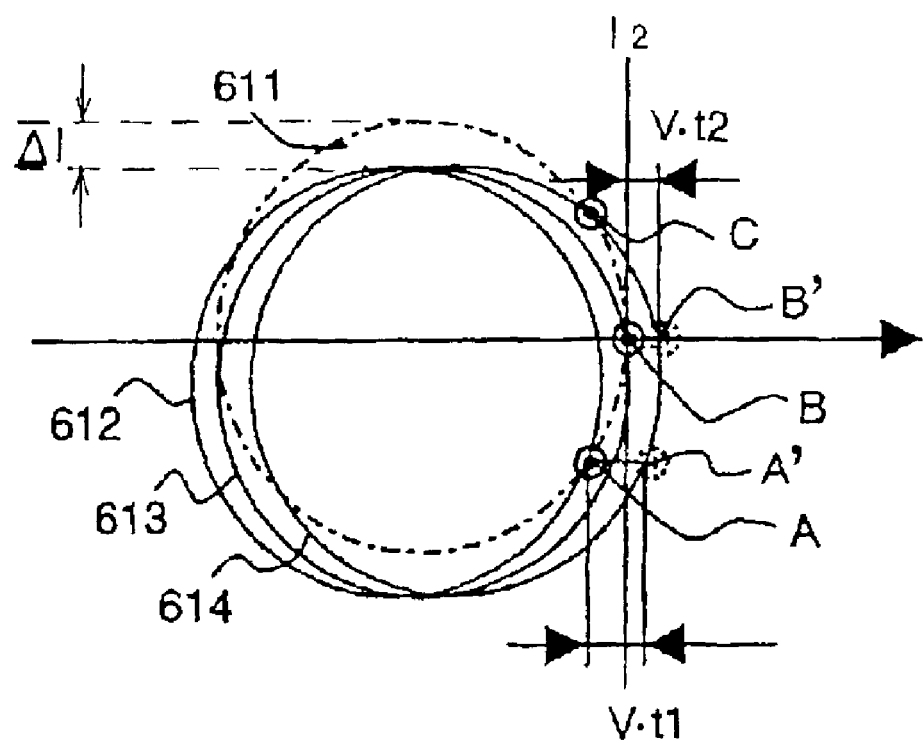
FIG. 5 is an explanatory view illustrating the location of the sensors constituting the position sensor and the location of the wafers being transferred.

FIG. 5 is an explanatory view illustrating the location of the sensors 13 constituting the position sensor, and the position of the wafer being transferred. As shown in the drawing, plural sensors are disposed at plural points, respectively. For example, three sensors are located at point A, point B and point C, respectively. The illustrated example shows the sensors to be disposed in an arc along the outer rim of the wafer, but they can also be arranged linearly. Further, 611 shows the correct position through which the wafer passes the reference line 12 in the arrow direction, and 612, 613 and 614 each show the actual position of the wafer being transferred along the arrow direction.

Similar to the example illustrated in FIG. 3, when the wafer passes the reference line at a location displaced by $\Delta l$ from the correct position, the sensor located at point A detects the wafer first. Thereafter, the sensor located at point B detects the wafer, and then the sensor located at point C does the same.

At first, when the wafer is transferred to the wafer position 612, the sensor located at point A detects the outer rim of the wafer. Thereafter, when the wafer is transferred to wafer position 613, the sensor located at point B detects the outer rim of the wafer. Finally, when the wafer is transferred to wafer position 614, the sensor located at point C detects the outer rim of the wafer.

When the sensor located at point C detects the outer rim of the wafer, the virtual position of the portion of the wafer that passed sensor A is located at point A' which is advanced by distance Vt1 from point A, assuming that time t1 has passed from detection and that the travel speed is V. Further, the virtual position of the portion of the wafer that passed sensor B is located at point B' which is advanced by distance Vt2 from point B, assuming that time t2 has passed from detection and that the travel speed is V.

When the virtual positions A' and B' are thus computed, based on these positions and the position of known point C, the center position of the wafer (circular wafer) can be computed. Further, based on this computed position, the displacement amount $\Delta l$ of the wafer can be computed.

Thereafter, the arm of the vacuum robot 10 is moved in the transverse direction for a distance corresponding to the computed displacement amount $\Delta l$, there by correcting the transfer position of the wafer to the proper position. Since the distance of movement of the wafer from reference line $l_2$ to the stage center of the processing chamber (distance of movement in the traveling direction) can be computed in advance, the movement can be controlled sufficiently based on fixed values. Though the distance of movement of the wafer from reference line $l_2$ to the stage center of the processing chamber (distance of movement in the traveling direction) includes an error $\delta$ corresponding to the displacement amount $\Delta l$ (when radius of wafer is represented by R, $\delta = R - (R^2 - \Delta l^2)^{1/2}$), the error is so small that it can be ignored.

As explained, according to the present embodiment, sensors 11a–11d for detecting the displacement of the transfer position are disposed in front of each processing chamber block so as to detect the displacement of the wafer directly before placing the wafer onto the stage inside the processing chamber. Thereafter, by controlling the transfer robot based on this detected result to correct the displacement, the wafer can be placed precisely at the determined position on the stage.

In the above example, the sensors for sensing the displacement of the wafer are disposed on the buffer chamber side of the gate valve of each processing chamber block, but the sensors can be disposed on the processing chamber side of the gate valve if necessary. Even further, the sensors can be positioned near the center of the buffer chamber.

Since according to the present embodiment the displacement of the wafer is detected or computed at the final step of the wafer transfer to each processing chamber, and the displacement occurring as a result of accumulated transfer errors is corrected at the last stage, the wafer can be transferred and mounted to the determined position on the stage within the processing chamber with high accuracy. The transfer accuracy performed by an operator based on visual observation is at best 3/10 mm to 2/10 mm, but the present embodiment enables to improve the accuracy by about ten times, or to the level of approximately 2/100 mm. Further, the sensors are not necessarily disposed near all the processing chambers (the main processing chambers and subsidiary processing chambers). For example, if the process performed within a certain processing chamber does not require highly accurate positioning, there is no need to dispose sensors for that processing chamber.

According to the present invention, the displacement of the transfer position of the wafer is detected and corrected directly prior to the final stage, so the wafer can be correctly transferred and positioned with high accuracy.

What is claimed is:

1. A vacuum processing device comprising:
   atmospheric transfer equipment disposed in an atmospheric transfer unit for transferring a wafer in air;
   a vacuum processing chamber for performing a predetermined treatment to a wafer transferred to and located on a predetermined position;
   a vacuum transfer equipment disposed within a vacuum transfer chamber connecting the atmospheric transfer unit and the vacuum processing chamber, for transferring the wafer received from the atmospheric transfer equipment to said predetermined position within the vacuum processing chamber;

a wafer position sensor disposed near an ingress path of the wafer leading to the vacuum processing chamber for detecting an actual position of the wafer being transferred by the vacuum transfer equipment, for comparing a correct position of the wafer passing a line which is predetermined in advance, and for sensing a displacement of the actual position of the wafer being transferred from the correction position thereof in a transverse direction with respect to the traveling direction; and a correction means for correcting the displacement of said wafer by moving an arm of the vacuum transfer equipment in the transverse direction with respect to the traveling direction based on the result of detection performed by said wafer position sensor.

2. A vacuum processing device according to claim 1, wherein the wafer position sensor comprises at least three optical sensors for sensing a rim position of the wafer being transferred by the vacuum transfer equipment.

3. A vacuum processing device according to claim 1, wherein an initial positioning of the wafer is performed using a unit disposed in atmosphere, and the displacement of the wafer is detected using a unit of the wafer position sensor disposed directly before a stage within the vacuum processing chamber.

* * * * *